US012588200B2

(12) United States Patent
Lee et al.

(10) Patent No.: US 12,588,200 B2
(45) Date of Patent: Mar. 24, 2026

(54) SEMICONDUCTOR DEVICE AND MANUFACTURING METHOD OF THE SEMICONDUCTOR DEVICE

(71) Applicant: SK hynix Inc., Icheon-si (KR)

(72) Inventors: Kun Young Lee, Icheon-si (KR); Sang Soo Kim, Icheon-si (KR); Nam Kuk Kim, Icheon-si (KR); Sang Wan Jin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 698 days.

(21) Appl. No.: 17/943,427

(22) Filed: Sep. 13, 2022

(65) Prior Publication Data

US 2023/0301096 A1    Sep. 21, 2023

(30) Foreign Application Priority Data

Mar. 16, 2022    (KR) ........................ 10-2022-0032835

(51) Int. Cl.
　　*H10B 43/10*　　(2023.01)
　　*H10B 43/27*　　(2023.01)
　　*H10B 43/40*　　(2023.01)
(52) U.S. Cl.
　　CPC ............. *H10B 43/27* (2023.02); *H10B 43/10* (2023.02); *H10B 43/40* (2023.02)
(58) Field of Classification Search
　　CPC ........ H10B 43/27; H10B 43/10; H10B 43/40; H10B 43/50; H10B 43/30; H10B 41/27; H10B 41/30; H10B 41/40; H10B 41/50; H10B 43/35
　　See application file for complete search history.

(56) References Cited

U.S. PATENT DOCUMENTS

| | | | | |
|---|---|---|---|---|
| 2021/0288058 A1* | 9/2021 | Nishimura | .............. | H10B 43/10 |
| 2022/0262744 A1* | 8/2022 | Masaki | .................. | H10B 41/27 |

FOREIGN PATENT DOCUMENTS

| | | |
|---|---|---|
| KR | 1020210002773 A | 1/2021 |
| KR | 1020210052934 A | 5/2021 |

* cited by examiner

*Primary Examiner* — Ajay Ojha
*Assistant Examiner* — Sandra Milena Rodriguez Villanu
(74) *Attorney, Agent, or Firm* — WILLIAM PARK AND ASSOCIATES LTD.

(57)　　　　　ABSTRACT

There are provided a semiconductor device and a manufacturing method thereof. The semiconductor device includes: a stack structure including a plurality of conductive patterns and a plurality of interlayer insulating layers, which are alternately stacked on a substrate; a plurality of channel structures extending in a first direction substantially perpendicular to the substrate to penetrate the stack structure; at least one first slit extending in a second direction substantially horizontal to the substrate while penetrating conductive patterns for select lines among the plurality of conductive patterns; a second slit extending in the second direction while penetrating the conductive patterns for select lines; and a plurality of support structures disposed on a bottom of the second slit, the plurality of support structures penetrating conductive patterns for word lines among the plurality of conductive patterns.

21 Claims, 17 Drawing Sheets

SEMICONDUCTOR DEVICE AND MANUFACTURING METHOD OF THE SEMICONDUCTOR DEVICE

CROSS-REFERENCE TO RELATED APPLICATION

The present application claims priority under 35 U.S.C. § 119(a) to Korean patent application number 10-2022-0032835 filed on Mar. 16, 2022, in the Korean Intellectual Property Office, the entire disclosure of which is incorporated by reference herein.

BACKGROUND

1. Technical Field

The present disclosure generally relates to an electronic device, and more particularly, to a semiconductor device and a manufacturing method of the semiconductor device.

2. Related Art

A nonvolatile memory device is a memory device in which stored data is retained, as it is, even when the supply of power is interrupted. As the improvement of the degree of integration of two-dimensional nonvolatile memory devices in which memory cells are formed in the form of a single layer over a substrate reaches the limit, there has recently been proposed a three-dimensional nonvolatile memory device in which memory cells are stacked vertically over a substrate.

The three-dimensional nonvolatile memory device includes interlayer insulating layers and gate electrodes, which are alternately stacked, and channel structures penetrating the interlayer insulating layers and the gate electrodes, and memory cells are stacked along the channel structures. Various structures and various manufacturing methods have been developed to improve the operational reliability of such a nonvolatile memory device having a three-dimensional structure.

SUMMARY

In accordance with an aspect of the present disclosure, there is provided a semiconductor device including: a stack structure including a plurality of conductive patterns and a plurality of interlayer insulating layers, which are alternately stacked on a substrate; a plurality of channel structures extending in a first direction substantially perpendicular to the substrate to penetrate the stack structure; at least one first slit extending in a second direction substantially horizontal to the substrate while penetrating conductive patterns for select lines among the plurality of conductive patterns; a second slit extending in the second direction while penetrating the conductive patterns for select lines; and a plurality of support structures disposed on a bottom of the second slit, the plurality of support structures penetrating conductive patterns for word lines among the plurality of conductive patterns.

In accordance with another aspect of the present disclosure, there is provided a method of manufacturing a semiconductor device, the method including: forming a first stack structure in which first material layers and second material layers are alternately stacked, on a substrate; forming first holes and dummy holes, which penetrate the first stack structure; filling a sacrificial pattern in the first holes and the dummy holes; forming a second stack structure in which third material layers and fourth material layers are alternately stacked, on the first stack structure; forming second holes overlapping with the first holes while penetrating the second stack structure, and removing the sacrificial pattern formed in the first holes; forming a channel layer in the first holes and the second holes; forming a line-shaped first slit overlapping with the dummy holes while penetrating the second stack structure, and removing the sacrificial pattern formed in the dummy holes; filling a gap fill layer in the first slit and the dummy holes, and exposing a sidewall of at least one fourth material disposed at an uppermost portion among the fourth material layers by etching a portion of a top end portion of the gap fill layer; forming a second slit penetrating the second stack structure and the first stack structure; and removing the second material layers and the fourth material layers, which are exposed through the second slit and the first slit, and filling a conductive pattern in spaces in which the second material layers and the fourth material layers are removed.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 3A and 3B are plan views illustrating a layout of a semiconductor device in accordance with an embodiment of the present disclosure.

DETAILED DESCRIPTION

Figure 1A:
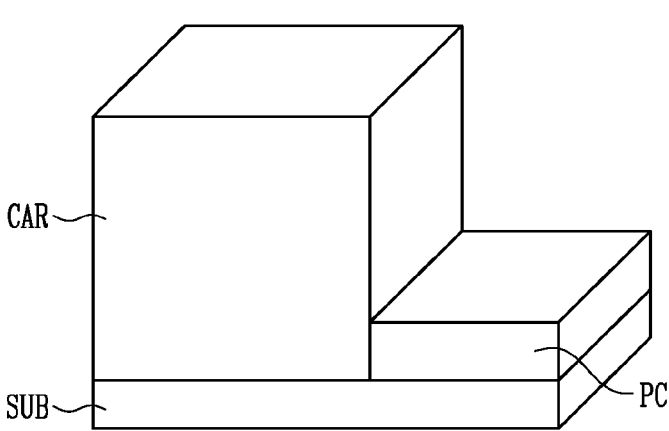
FIGS. 1A and 1B are block diagrams schematically illustrating semiconductor devices in accordance with embodiments of the present disclosure.

Hereinafter, embodiments of the present disclosure will be described. In drawings, thicknesses and distances are expressed for convenience of description, and may be exaggerated and illustrated as compared with actual physical thicknesses and distances. In the present specification, a known configuration unrelated to the present disclosure may be omitted. In the specification, when reference numerals are endowed to components in each drawing, it should be noted that like reference numerals denote like elements even though they are depicted in several drawings.

In the entire specification, when an element is referred to as being "on", "connected" or "coupled" to another element, it can be directly on, connected or coupled to the another element or be indirectly on, connected or coupled to the another element with one or more intervening elements interposed therebetween. In the entire specification, when an element is referred to as "including" another element, the element should not be understood as excluding other elements so long as there is no special conflicting description, and the element may include at least one other element.

Embodiments provide a semiconductor device having a stable structure and improved characteristics, and a manufacturing method of the semiconductor device.

Figure 1B:
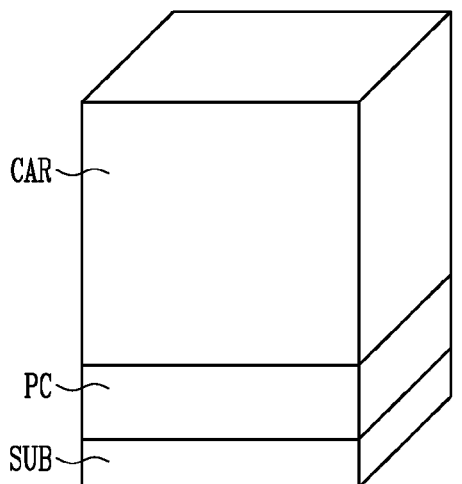

FIGS. 1A and 1B are block diagrams schematically illustrating semiconductor devices in accordance with embodiments of the present disclosure.

Referring to FIGS. 1A and 1B, each of the semiconductor devices in accordance with the embodiments of the present disclosure may include a peripheral circuit structure PC and a cell array CAR, which are disposed on a substrate SUB.

The substrate SUB may be a single crystalline semiconductor layer. For example, the substrate SUB may be a bulk silicon substrate, a silicon on insulator substrate, a germanium substrate, a germanium on insulator substrate, a silicon-germanium substrate, or an epitaxial thin film formed through a selective epitaxial growth process.

The cell array CAR may include a plurality of memory blocks. Each of the memory blocks may include a plurality of cell strings. Each of the cell strings is electrically connected to a bit line, a source line, word lines, and select lines. Each of the cell strings may include memory cells and select transistors, which are connected in series. Each of the select lines is used as a gate electrode of a select transistor corresponding thereto, and each of the word lines is used as a gate electrode of a memory cell corresponding thereto.

The peripheral circuit structure CS may include NMOS and PMOS transistors, a resistor, and a capacitor, which are electrically connected to the cell array CAR. The NMOS and PMOS transistors, the resistor, and the capacitor may be used as elements constituting a row decoder, a column decoder, a page buffer, and a control circuit.

As shown in FIG. 1A, the peripheral circuit structure PC may be disposed on a partial region of the substrate SUB, which does not overlap with the cell array CAR.

Alternatively, as shown in FIG. 1B, the peripheral circuit structure PC may be disposed between the cell array CAR and the substrate SUB. The peripheral circuit structure PC overlaps with the cell array CAR, and hence an area of the substrate SUB occupied by the cell array CAR and the peripheral circuit structure PC can be reduced.

Figure 2:
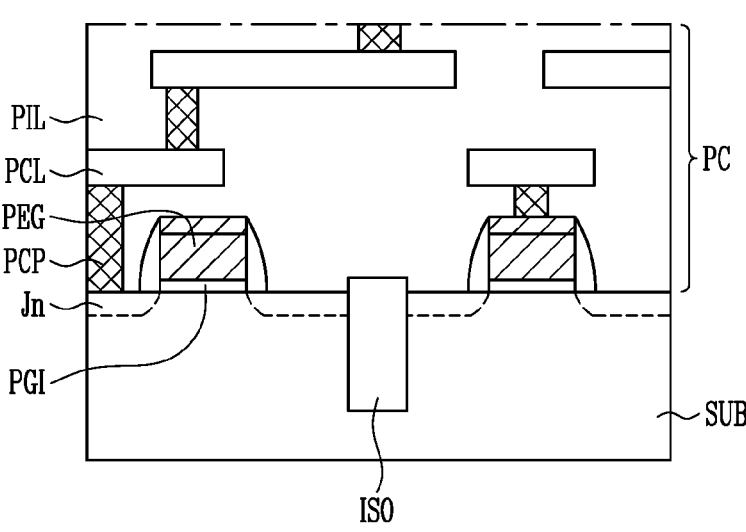
FIG. 2 is a sectional view schematically illustrating a peripheral circuit structure.

FIG. 2 is a sectional view schematically illustrating a peripheral circuit structure. The peripheral circuit structure PC shown in FIG. 2 may be included in the peripheral circuit structure shown in FIG. 1A or be included in the peripheral circuit structure shown in FIG. 1B.

Referring to FIG. 2, the peripheral circuit structure PC may include peripheral gate electrodes PEG, a peripheral gate insulating layer PGI, junctions in, peripheral circuit lines PCL, peripheral contact plugs PCP, and a peripheral circuit insulating layer PIL.

Each of the peripheral gate electrodes PEG may be used as a gate electrode of each of NMOS and PMOS transistors of the peripheral circuit structure PC. The peripheral gate insulating layer PGI may be disposed between each of the peripheral gate electrodes PEG and the substrate SUB.

The junctions Jn are regions defined by implanting an n-type or p-type impurity into an active region of the substrate SUB. The junctions in may be disposed at both sides of each of the peripheral gate electrodes PEG to be used as source and drain junctions. The active region of the substrate SUB may be partitioned by an isolation layer ISO formed inside the substrate SUB. The isolation layer ISO may be formed of an insulating material.

The peripheral circuit lines PCL may be electrically connected to a circuit of the peripheral circuit structure PC through the peripheral contact plugs PCP.

The peripheral circuit insulating layer PIL may cover the circuit of the peripheral circuit structure PC, the peripheral circuit lines PCL, and the peripheral contact plugs PCP. The peripheral circuit insulating layer PIL may include insulating layers stacked in a multi-layer structure.

Figure 3A:
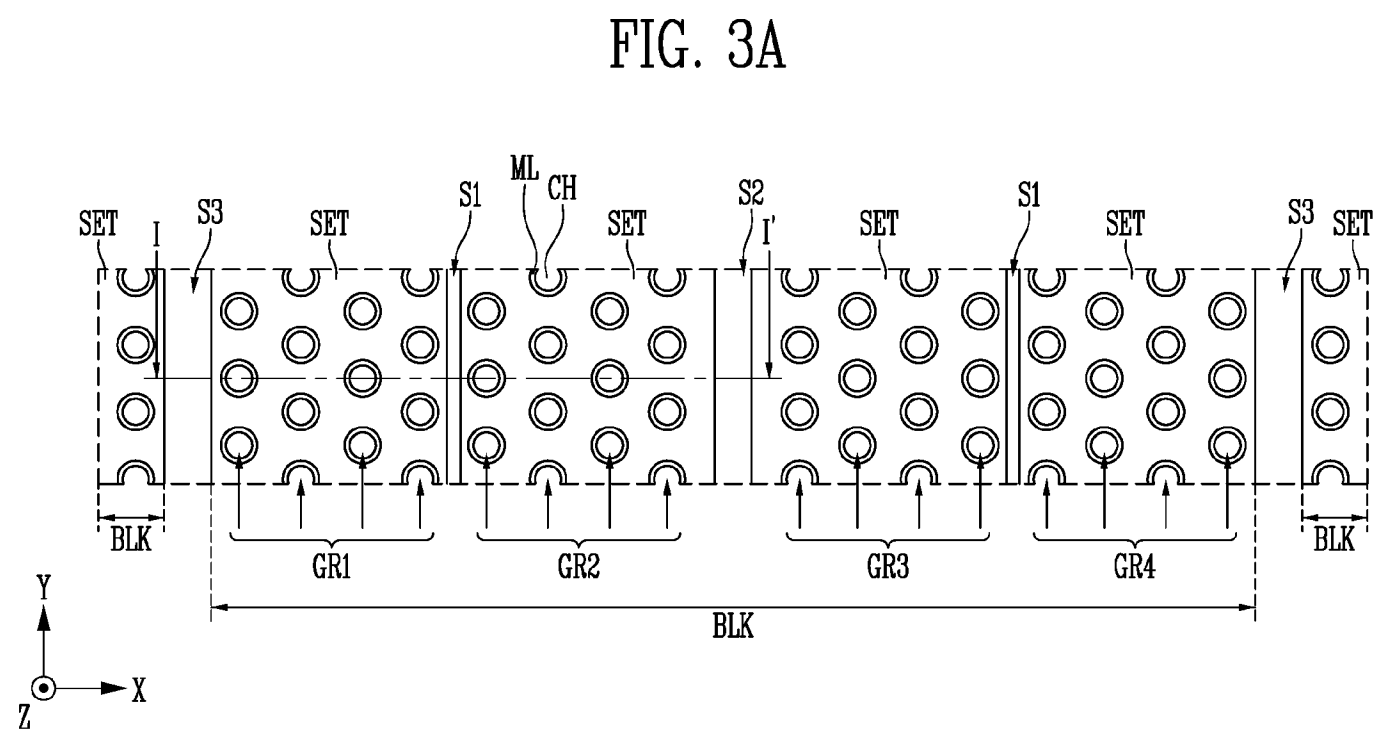
Figure 3B:
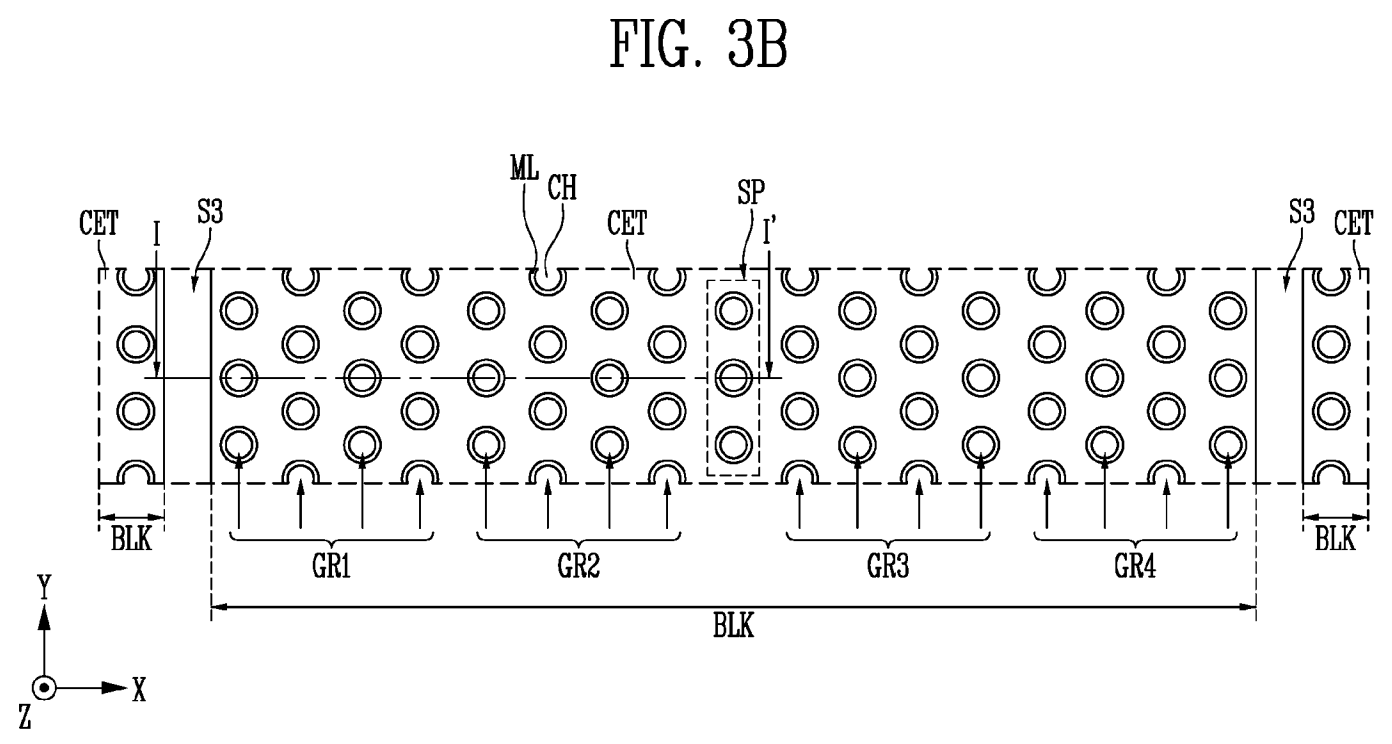

FIGS. 3A and 3B are plan views illustrating a layout of a semiconductor device in accordance with an embodiment of the present disclosure.

FIG. 3A illustrates a layout of select stack structures SET, and FIG. 3B illustrates a layout of a cell stack structure CET. The select stack structures SET shown in FIG. 3A may be disposed on the cell stack structures CET shown in FIG. 3B.

The select stack structures SET and the cell stack structures CET may constitute memory blocks BLK.

The select stack structure SET may be isolated from each other by first slits S1, at least one second slit S2, and third slits S3. A plurality of first slits S1 may be disposed between third slits S3 adjacent to each other in a first horizontal direction X. For example, two first slits S1 may be disposed between the third slits S3 adjacent to each other in the first horizontal direction X. In addition, at least one second slit S2 may be disposed between first slits S1 adjacent to each other in the first horizontal direction X. The third slits S3 may be respectively disposed at boundaries between memory blocks BLK.

The third slits S3 may extend between the cell stack structures CET. Each of the cell stack structure CET may extend in the first horizontal direction X between the third slits S3 adjacent to each other, and overlap with the first slits S1.

A support structure SP may be disposed on the bottom of the at least one second slit S2. The support structure SP may be disposed while penetrating the cell stack structures CET in a first direction Z as a direction vertical to a substrate. The support structure SP may have a cylindrical shape.

Each of the select stack structures SET and the cell stack structures CET may extend in the first horizontal direction X and a second horizontal direction Y, which intersect each other. Each of the select stack structures SET and the cell stack structures CET may include line patterns stacked in the first direction Z. The first direction Z may be a direction vertically intersecting the first horizontal direction X and the second horizontal direction Y. The line patterns may include interlayer insulating layers and conductive patterns. A stacked structure of interlayer insulating layers and conductive patterns will be described later with reference to FIG. 4.

Each of the first slits S1, the at least one second slit S2, and the third slits S3 may extend in the second horizontal direction Y. Chanel structures CH may be disposed both sides of each of the third slits S3. Each of the channel structures CH may extend in the first direction Z, and penetrate the select stack structures SET and the cell stack structures CET. In an embodiment, each of the channel structures CH may extend in the first direction Z substantially perpendicular to the substrate SUB to penetrate the select stack structure SET and the cell stack structure CET.

Figure 4:
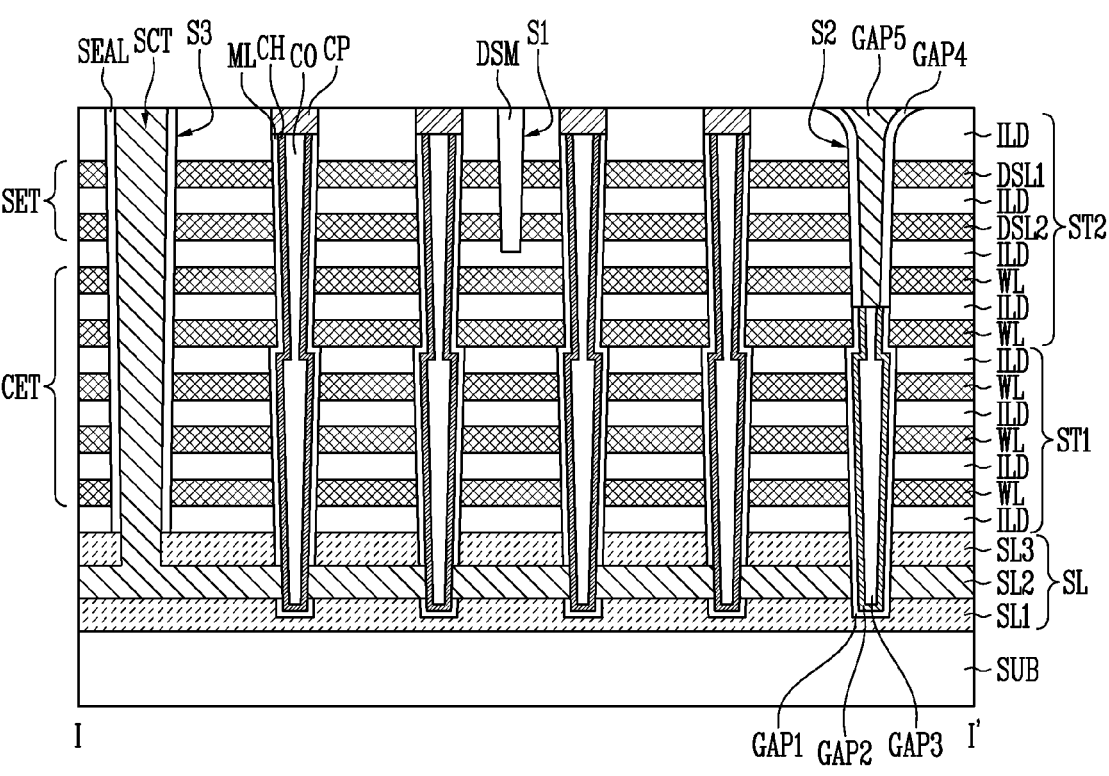
FIG. 4 is a sectional view illustrating a semiconductor device in accordance with an embodiment of the present disclosure.

In an embodiment, the channel structures CH may extend through a bottom of the stack structure to an inside of the source structure SL, as for example, shown in FIG. 4. Each of the channel structures CH may be formed in a cylindrical shape. The channel structures CH disposed between the third slits S3 adjacent to each other may be divided into a plurality of channel groups (e.g., GR1 to GR4) by the first slits S1 and the second slit S2. In other words, each of the memory blocks BLK may include two or more channel groups GR1 to GR4 shared by a cell stack structure CET corresponding thereto. Channel groups GR1 to GR4 shared by one cell stack structure CET may be individually controlled respectively by select stack structures SET divided by the first slits S1 and the second slit S2. Each channel group GR1, GR2, GR3, and GR4 may include channel structures CH of one column or more.

Each of the first slits S1, the second slit S2, and the third slits S3 may extend in a linear shape in the second horizontal direction Y. In an embodiment, each of the first slits S1, the second slit S2, and the third slits S3 may extend in a linear shape in the second horizontal direction Y and have a depth as shown, for example, in FIG. 4. For example, the second slit S2 may extend in the second horizontal direction Y substantially horizontal to the substrate while penetrating at least part of the second stack structure ST2. However, the present disclosure is not limited thereto. In an embodiment, each of the first slits S1 may be formed in a zigzag shape. In an embodiment, each of the first slits S1 may be formed in a wave shape.

A width of each first slits S1 may be formed different from a width of the second slit S2 and a width of each third slit S3. More specifically, each first slit S1 may be formed narrower in the second horizontal direction Y than the second slit S2 and each third slit S3.

The channel structures CH may be disposed in zigzag. However, the present disclosure is not limited thereto. In an embodiment, the channel structures CH may be arranged side by side in the first horizontal direction X and the second horizontal direction Y. A memory layer ML may be disposed between each channel structure CH and a cell stack structure CET corresponding thereto. The memory layer ML may extend between each channel structure CH and a select stack structure SET corresponding thereto. A core insulating layer CO (see FIG. 4) extending in the first direction Z may be disposed inside the channel structures CH, and a capping layer CP (see FIG. 4) may be disposed on the top of the channel structures CH and the core insulating layer CO.

In accordance with the above-described embodiment, a plurality of support structures SP extending in the first direction Z while penetrating the cell stack structures CET may be disposed on the bottom of the second slit S2 extending in the second horizontal direction Y while penetrating the select stack structures SET. The second slit S2 and the plurality of support structure SP may be physically in contact with each other. The second slit S2 may extend in the first direction Z to penetrate portions of top end portions of the cell stack structures CET.

FIG. 4 is a sectional view illustrating a semiconductor device in accordance with an embodiment of the present disclosure.

FIG. 4 illustrates a stacked structure of the select stack structures SET shown in FIG. 3A and the cell stack structures CET shown in FIG. 3B. FIG. 4 illustrates a section of a memory block taken along line I-I' shown in each of FIGS. 3A and 3B. In the following drawing, a case where the cell stack structures CET are disposed on a substrate SUB is illustrated as an example. As shown in FIG. 1B, a peripheral circuit structure PC may be disposed on the substrate SUB, and the cell stack structures CET may be disposed on the peripheral circuit structure PC.

Referring to FIG. 4, the semiconductor device in accordance with the embodiment of the present disclosure may include a source structure SL, a first stack structure ST1, and a second stack structure ST2, which are sequentially stacked on the substrate SUB. In an embodiment, a first stack structure ST1 and a second stack structure ST2 may constitute a stack structure.

The source structure SL may include a plurality of source layers SL1, SL2, and SL3 sequentially stacked on the substrate SUB. The source structure SL may include a conductive material. In an embodiment, the source structure SL may include a first source layer SL1, a second source layer SL2, and a third source layer SL3, which are sequentially stacked on the substrate SUB. Hereinafter, although a case where the source structure SL includes the first to third source layers SL1, SL2, and SL3 is described as an example, the structure of the source structure SL is not limited thereto. In another example, unlike as illustrated in the drawing, the source structure SL may be configured with a single layer.

The second source layer SL2 of the source structure SL may be electrically and physically connected to a source contact SCT.

The first stack structure ST1 and the second stack structure ST2, which are disposed on the top of the source structure SL may include interlayer insulating layers ILD and conductive patterns WL, DSL1, and DSL2. Each of the interlayer insulating layers ILD and the conductive patterns WL, DSL1, and DSL2 may be the line patterns extending in the second horizontal direction Y, which are shown in FIGS. 3A and 3B.

A portion of the second stack structure ST2 may be defined as select stack structures SET, and the first stack structure ST1 and a portion of the second stack structure ST2 may be defined as cell stack structures CET. For example, the select stack structures SET may include conductive patterns DSL1 and DSL2 disposed at an upper portion of the second stack structure ST2. The conductive patterns DSL1 and DSL2 may be lines for drain select lines. For example, the cell stack structures CET may include conductive patterns WL disposed in the first stack structure ST1 and the second stack structure ST2. The conductive patterns WL may be lines for word lines.

A first slit S1 may be disposed inside the second stack structure ST2. The first slit S1 may isolate select stack structures SET included in the second stack structure ST2 from each other. The first slit S1 may be filled with a drain select isolation structure DSM. The drain select isolation structure DSM may be configured with an insulating material.

A second slit S2 may be disposed inside the second stack structure ST2. The second slit S2 may isolate select stack structures SET included in the second stack structure ST2 from each other. The second slit S2 may isolate some cell stack structures CET adjacent to the select stack structures SET among the cell stack structures CET included in the second stack structure ST2 from each other. The second slit S2 may include a fourth gap fill layer GAP4 and a fifth gap fill layer GAP5. In an embodiment, the second slit S2 may have a depth (i.e., in the Z direction towards the substrate SUB) equal to or lower than a depth of the first slit S1 as illustrated in FIG. 4.

A support structure may include a first gap fill layer GAP1, a second gap fill layer GAP2, and a third gap fill layer GAP3 penetrating conductive patterns WL and interlayer insulating layers ILD, which are included in the second stack structure ST2, and the conductive patterns WL and the interlayer insulating layers ILD, which are included in the first stack structure ST1, and may be disposed on the bottom of the second slit S2. The support structure may have a cylindrical structure extending in a direction vertical to the substrate SUB.

A third slit S3 may be disposed inside the first stack structure ST1 and the second stack structure ST2. The third slit S3 may be filled with an insulating material, or include the source contact SCT and a sealing layer SEAL surrounding a sidewall of the source contact SCT.

A boundary between the first stack structure ST1 and the second stack structure ST2 may be partitioned by the third slit S3.

Each of the conductive patterns WL, DSL1, and DSL2 and the interlayer insulating layers ILD may surround channel structures CH penetrating the first stack structure ST1 and the second stack structure ST2. A memory layer ML may be disposed between the first and second stack structures ST1 and ST2 and each channel structure CH. The memory layer ML may extend along a sidewall of a channel structure corresponding thereto. However, the embodiment of the present disclosure is not limited thereto. The channel structures CH may extend to the inside of the source structure SL. The channel structures CH may be electrically and physically connected to the second source layer SL2 of the source structure SL.

Each of the conductive patterns WL, DSL1, and DSL2 may include at least one of a silicon layer, a metal silicide layer, a metal layer, and a metal nitride layer. In an embodiment, each of the conductive patterns WL, DSL1, and DSL2 may include a metal such as tungsten (W) to achieve low resistance wiring. In an embodiment, a barrier layer (not shown) may be further formed, which is used to prevent or mitigate a direct contact between each of the conductive patterns WL, DSL1, and DSL2 and an interlayer insulating layer ILD adjacent thereto and a direct contact between each of the conductive patterns WL, DSL1, and DSL2 and the memory layer ML. The barrier layer may be formed as a metal nitride layer. For example, the barrier layer may include a titanium nitride layer, a tungsten nitride layer, or a tantalum nitride layer.

Each of the interlayer insulating layers ILD may be formed of various insulating materials. For example, each of the interlayer insulating layers ILD may include a silicon oxide layer.

FIGS. 5A to 5K are sectional views illustrating a manufacturing method of a semiconductor device in accordance with an embodiment of the present disclosure.

The manufacturing method described below is merely an embodiment a method of manufacturing the semiconductor device shown in FIGS. 3A, 3B, and 4, and the method of manufacturing the semiconductor device shown in FIGS. 3A, 3B, and 4 might not be limited to the manufacturing method described below.

Figure 5A:
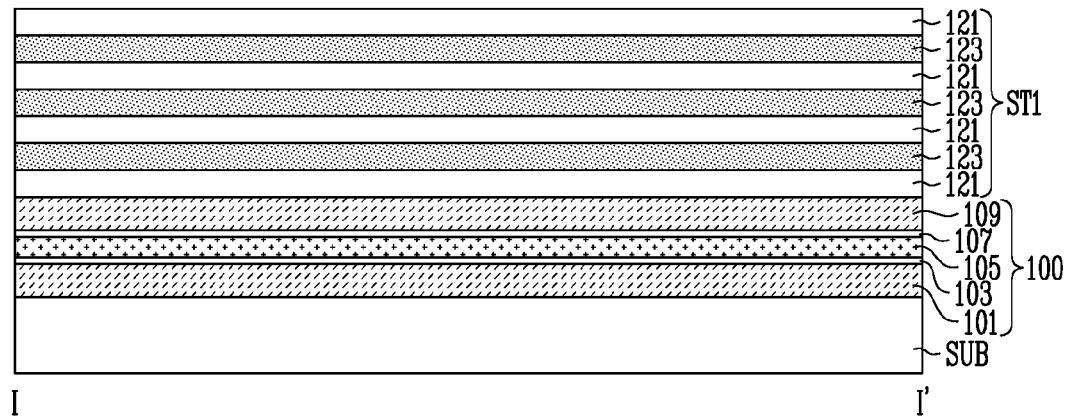
FIGS. 5A, 5B, 5C, 5D, 5E, 5F, 5G, 5H, 5I, 5J, and 5K are sectional views illustrating a manufacturing method of a semiconductor device in accordance with an embodiment of the present disclosure.

Referring to FIG. 5A, a lower stack structure 100 may be formed on a substrate SUB. The lower stack structure 100 may include a lower semiconductor layer 101, a sacrificial layer 105, and an upper semiconductor layer 109, which are sequentially stacked. Before the sacrificial layer 105 is deposited on the lower semiconductor layer 101, a first protective layer 103 may be formed on the lower semiconductor layer 101. Before the upper semiconductor layer 109 is formed on the lower semiconductor layer 101 or the first protective layer 103, a second protective layer 107 may be formed on the lower semiconductor layer 101 or the first protective layer 103.

The lower semiconductor layer 101 may include a doped semiconductor layer including a conductivity type impurity. For example, the lower semiconductor layer 101 may include an n-type doped silicon layer. The sacrificial layer 105 may include a material having an etch rate different from an etch rate of each of the first protective layer 103 and the second protective layer 107, and each of the first protective layer 103 and the second protective layer 107 may include a material having an etch rate different from an etch rate of each of the lower semiconductor layer 101 and the upper semiconductor layer 109. For example, the sacrificial layer 105 may include an undoped silicon layer, and each of the first protective layer 103 and the second protective layer 107 may include an oxide layer. The upper semiconductor layer 109 may include a semiconductor layer. For example, the upper semiconductor layer 109 may include doped silicon layer or an undoped silicon layer. The lower semiconductor layer 101 may be the first source layer SL1 shown in FIG. 4, and the upper semiconductor layer 109 may be the third source layer SL3 shown in FIG. 4.

Subsequently, a first stack structure ST1 may be formed on the lower stack structure 100. The first stack structure ST1 may include first material layers 121 and second material layers 123, which are alternately stacked.

The first material layers 121 may include a material different from a material of the second material layers 123. In an embodiment, the first material layers 121 may include an insulating material, and the second material layers 123 may include a sacrificial insulating material having an etch rate different from an etch rate of the first material layers 121. For example, each of the first material layers 121 may include oxide, and each of the second material layers 123 may include nitride.

Figure 5B:
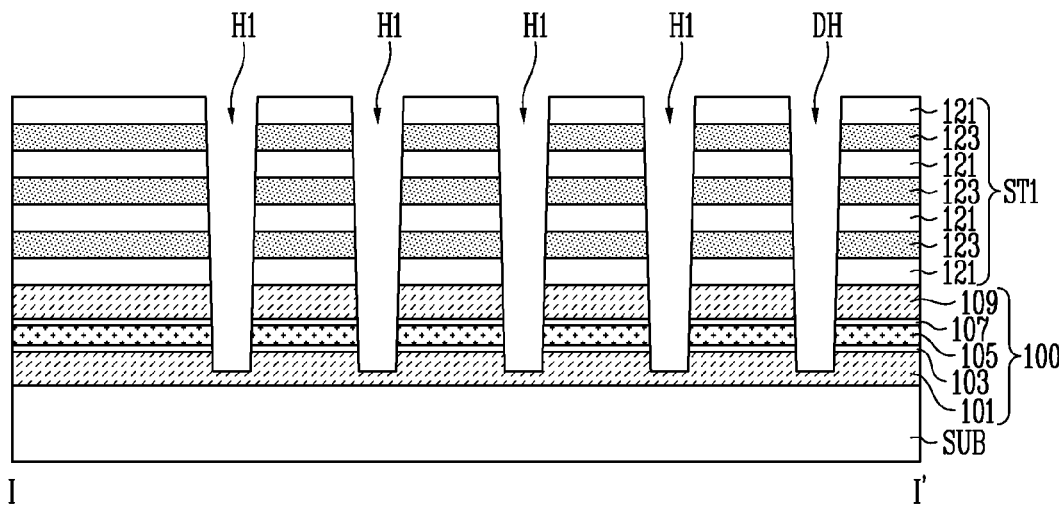

Referring to FIG. 5B, a plurality of first holes H1 and a plurality of dummy holes DH may be formed by performing an etching process. The plurality of first holes H1 and the plurality of dummy holes DH may extend to the inside of the lower stack structure 100 while penetrating the first stack structure ST1. The plurality of first holes H1 and the plurality of dummy holes DH may penetrate the upper semiconductor layer 109, the second protective layer 107, the sacrificial layer 105, and the first protective layer 103. The plurality of first holes H1 and the plurality of dummy holes DH may extend to the inside of the lower semiconductor layer 101 of the lower stack structure 100.

Figure 5C:
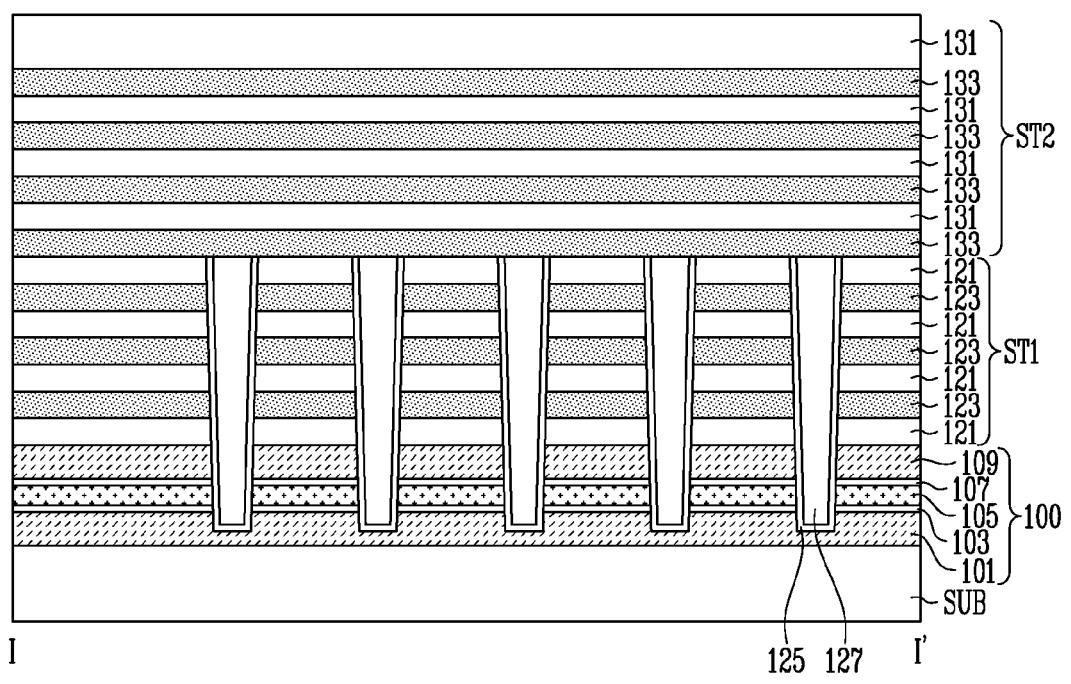

Referring to FIG. 5C, a sacrificial pattern 127 may be formed inside the plurality of first holes H1 and the plurality of dummy holes DH, which are shown in FIG. 5B. The sacrificial pattern 127 may be configured to include carbon. In addition, before the sacrificial pattern 127 is formed, a protective layer 125 may be formed on bottom surfaces and sidewalls of the plurality of first holes H1 and the plurality of dummy holes DH. That is, the protective layer 125 may be formed, which surrounds a bottom surface and a sidewall of the sacrificial pattern 127. The protective layer 125 may be formed of TiN.

Subsequently, a second stack structure ST2 may be formed on the first stack structure ST1. The second stack structure ST2 may include third material layers 131 and fourth material layers 133, which are alternately stacked.

The third material layers 131 may include a material different from a material of the fourth material layers 133. In an embodiment, the third material layers 131 may include an insulating material, and the fourth material layers 133 may include a sacrificial insulating material having an etch rate different from an etch rate of the third material layers 131. For example, each of the third material layers 131 may include silicon oxide, and each of the fourth material layers 133 may include silicon nitride. For example, each of the third material layers 131 may include the same material as the first material layers 121, and each of the fourth material layers 133 may include the same material as the second material layers 123.

Figure 5D:
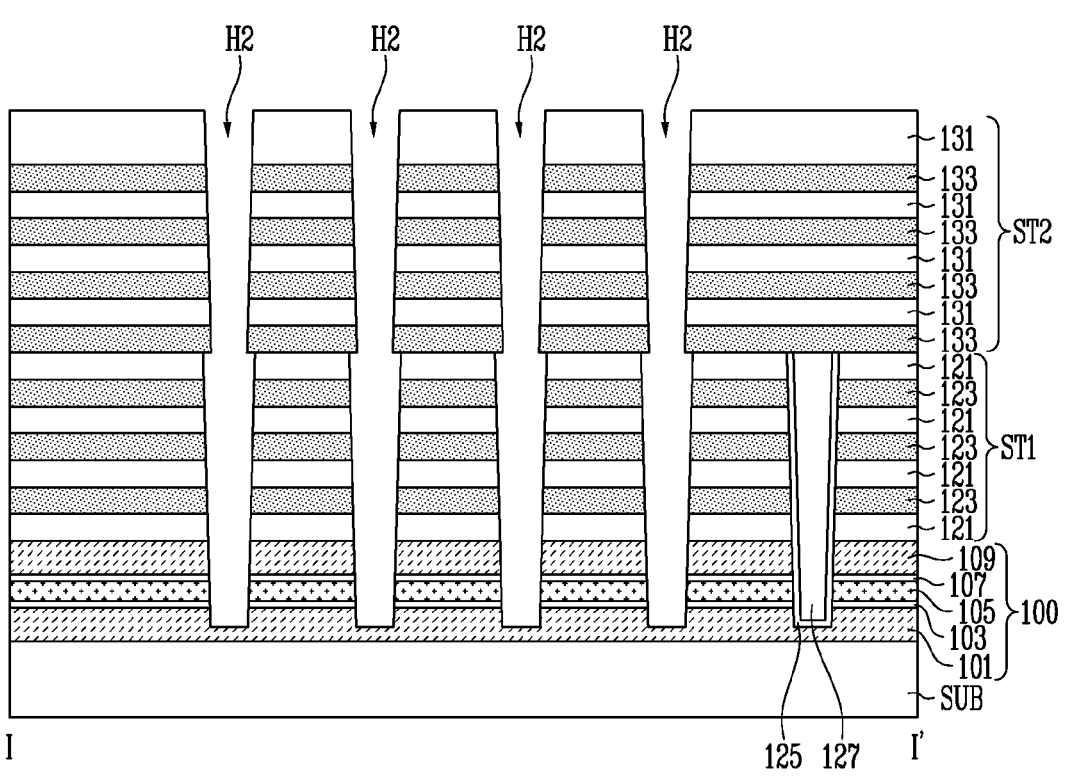

Referring to FIG. 5D, a plurality of second holes H2 may be formed by performing an etching process. The plurality of second holes H2 may be formed to overlap with the plurality of first holes H1. Therefore, the protective layer (127 shown in FIG. 5C) and the sacrificial pattern (125 shown in FIG. 5C), which are formed inside the first holes H1, may be exposed through the second holes H2. Subsequently, the exposed protective layer (127 shown in FIG. 5C) and the exposed sacrificial pattern (125 shown in FIG. 5C) may be removed.

Figure 5E:
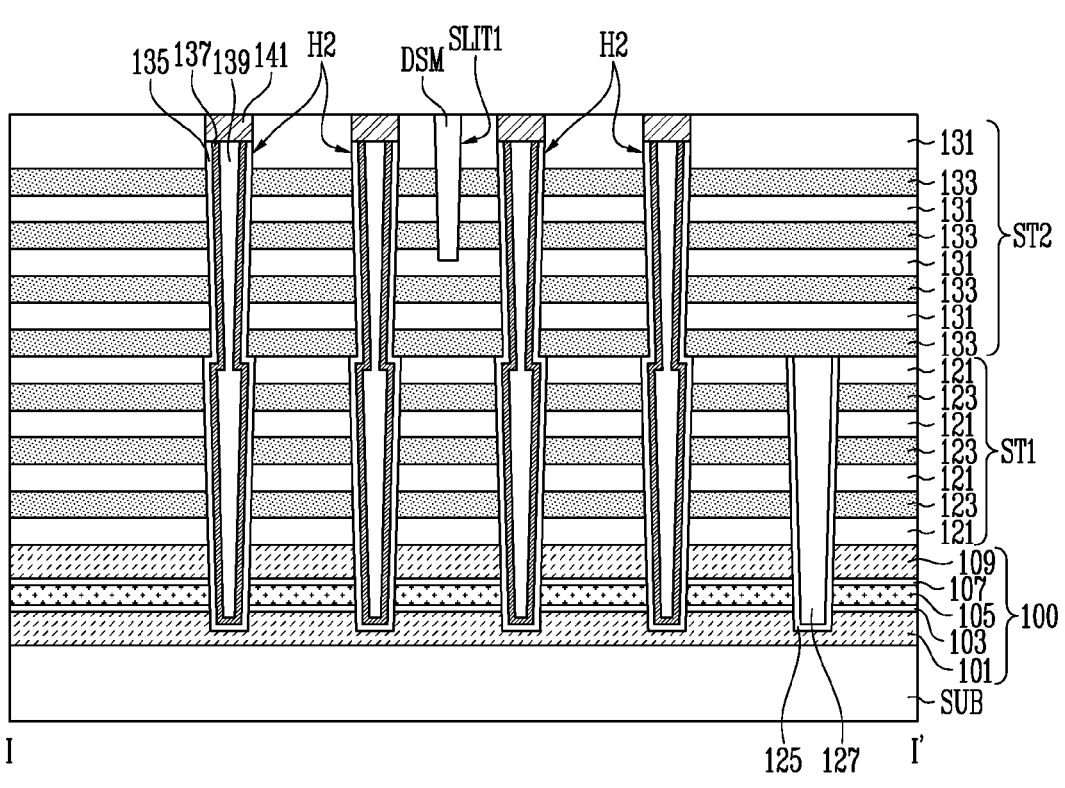

Referring to FIG. 5E, a memory layer 135 may be conformally formed on surfaces of the second holes H2. The memory layer 135 may include a tunnel insulating layer, a data storage layer, and a blocking insulating layer.

A channel layer 137 may be formed in central regions of the second holes H2, which are opened by the memory layer 135. The channel layer 137 may be formed in a pillar shape filling the central regions of the second holes H2, which are opened by the memory layer 135. Alternatively, the channel layer 137 may be conformally formed along a surface of the memory layer 135, and central regions of the second holes H2 may be opened. The central regions of the second holes H2, which are opened by the channel layer 137, may be filled with a core insulating layer 139. The core insulating layer 139 may be formed with a height lower a height of each of the channel layer 137 and the second holes H2. A capping layer 141 may be formed on the core insulating layer 139.

The channel layer 137 may include a silicon layer. The capping layer 141 may include an n-type doped silicon layer. The core insulating layer 139 may include oxide.

Subsequently, a first slit SLIT1 may be formed by etching a portion of a top end portion of the second stack structure ST2 through an etching process. The etching process may be performed such that at least one fourth material layer 133 among fourth material layers 133 disposed at the top end portion of the second stack structure ST2 is penetrated. The first slit SLIT1 may extend in a line shape in a first direction horizontal to the substrate SUB. In an embodiment, the first slit SLIT1 extending in the line shape in the first direction horizontal to the substrate SUB may be referred to as a line-shaped first slit. Subsequently, a drain select isolation structure DSM may be formed by filling the first slit SLIT1 with an insulating material.

Figure 5F:
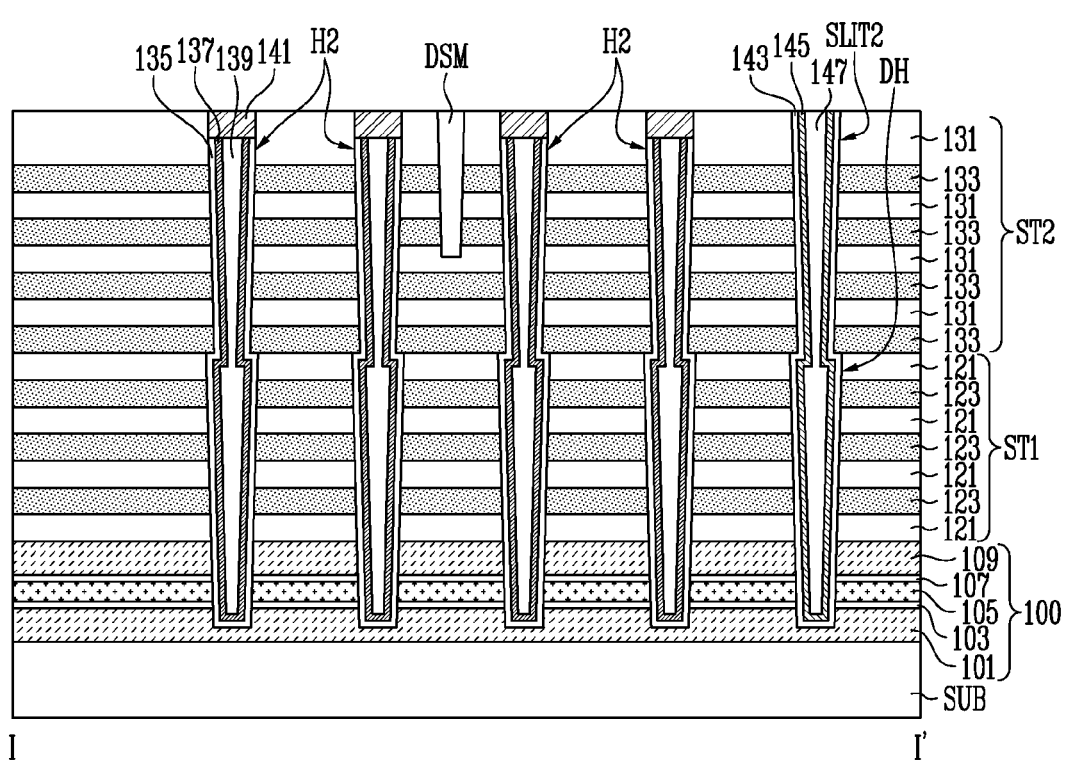

Referring to FIG. 5F, a second slit SLIT2 overlapping with the dummy hole DH while penetrating the second stack structure ST2 may be formed by an etching process. The second slit SLIT2 may have a line shape extending in a direction parallel to the first slit (SLIT1 shown in FIG. 5E). The protective layer (127 shown in FIG. 5E) and the sacrificial pattern (125 shown in FIG. 5E) may be exposed by the second slit SLIT2.

Subsequently, a first gap fill layer 143 may be conformally on surfaces of the second slit SLIT2 and the dummy hole DH. In another embodiment, the first gap fill layer 143 may be formed to cover sidewall surfaces of the second material layers 123 and the fourth material layers 133, which are exposed by the second slits SLIT2 and the dummy hole DH. The first gap fill layer 143 may be formed by using an oxidation process.

Subsequently, a second gap fill layer 145 may be formed along a surface of the first gap fill layer 143, and a third gap fill layer 147 may be formed on a surface of the second gap fill layer 145, thereby burying the dummy hole DH and the second slit SLIT2. The second gap fill layer 145 may be formed as a poly-silicon layer, and the third gap fill layer 147 may be formed as a PSZ layer. In an embodiment, at least one of the first to third gap fill layers 143, 145, and 147 may constitute a gap fill layer.

Figure 5G:
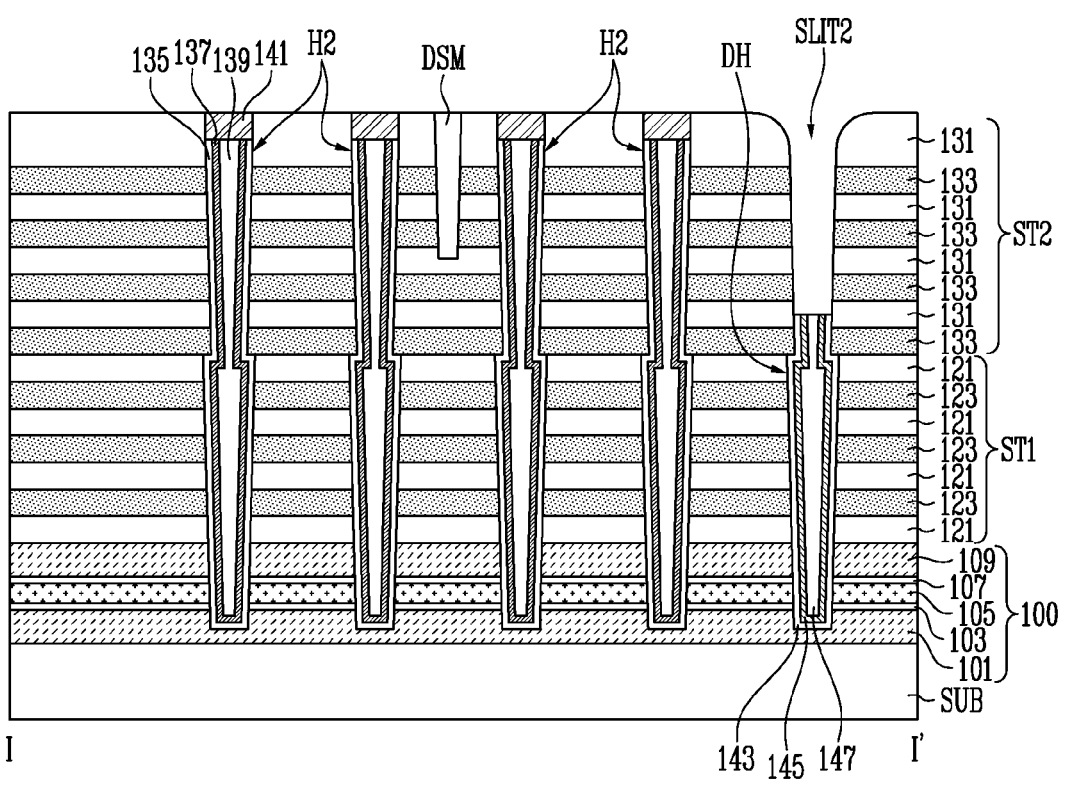

Referring to FIG. 5G, a sidewall of at least one fourth material layer 133 located at an upper portion among the plurality of fourth material layers 133 included in the second stack structure ST2 may be exposed by etching the first to third gap fill layers 143, 145, and 147 formed in the second slit SLIT2 through an etching process. The fourth material layers 133 of which sidewalls are exposed may preferably include fourth material layers replaced with conductive patterns for drain select lines in a subsequent process. A height of an uppermost end of the first to third gap fill layers 143, 145, and 147 remaining after the etching process may be equal to or lower than a height of a bottom surface of the drain select isolation structure DSM. Accordingly, a height of a bottom surface of the second slit SLIT2 may be equal to or lower than a height of a bottom surface of the first slit (SLIT1 shown in FIG. 5E).

Subsequently, an opening of the second slit SLIT2 may be extended by performing an additional etching process.

Figure 5H:
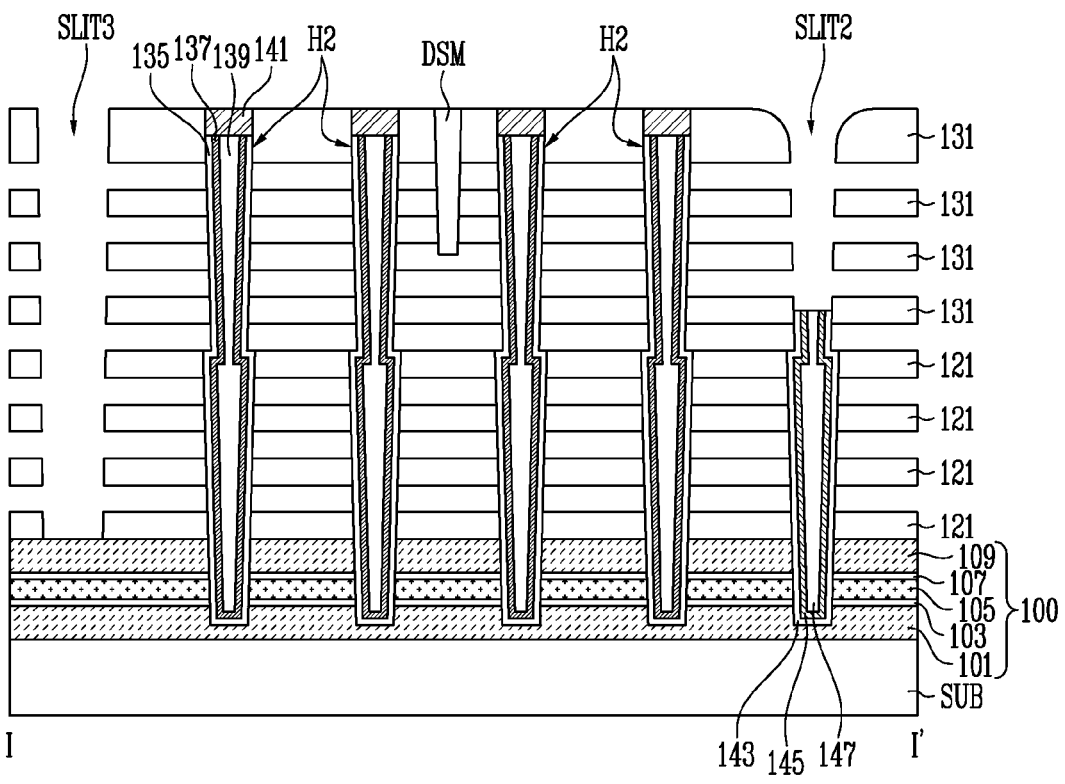

Referring to FIG. 5H, a third slit SLIT3 penetrating the second stack structure (ST2 shown in FIG. 5G) and the first stack structure (ST1 shown in FIG. 5G) may be formed by performing an etching process. The third slit SLIT3 may extend in the same direction as the first slit (SLIT1 shown in FIG. 5E) and the second slit SLIT2.

Subsequently, a horizontal space may be formed by removing the second material layers and the fourth material layers, which are exposed through the third slit SLIT3 and the second slit SLIT2.

In a removing process of the second and fourth material layers for forming the above-described horizontal space, the fourth material layers of the second stack structure (ST2 shown in FIG. 5G) are removed through the second slit SLIT2 in addition to the third slit SLIT3. Thus, the removing process can be more easily performed.

Figure 5I:
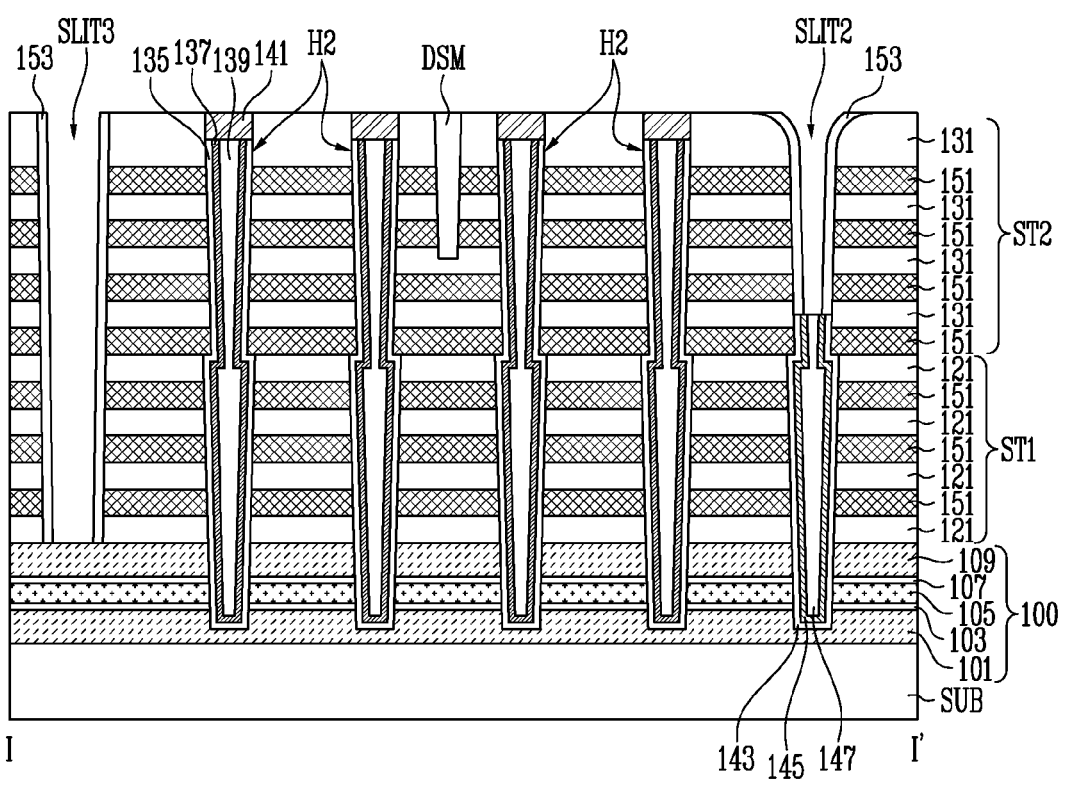

Referring to FIG. 5I, conductive patterns 151 may be formed in spaces in which the second material layers and the fourth material layers are removed.

Subsequently, a sealing layer 153 may be formed on a sidewall of the third slit SLIT3. The sealing layer 153 may be formed on a sidewall of the second slit SLIT2, and the sealing layer 153 formed on the sidewall of the second slit SLIT2 may be defined as a fourth gap fill layer.

Figure 5J:
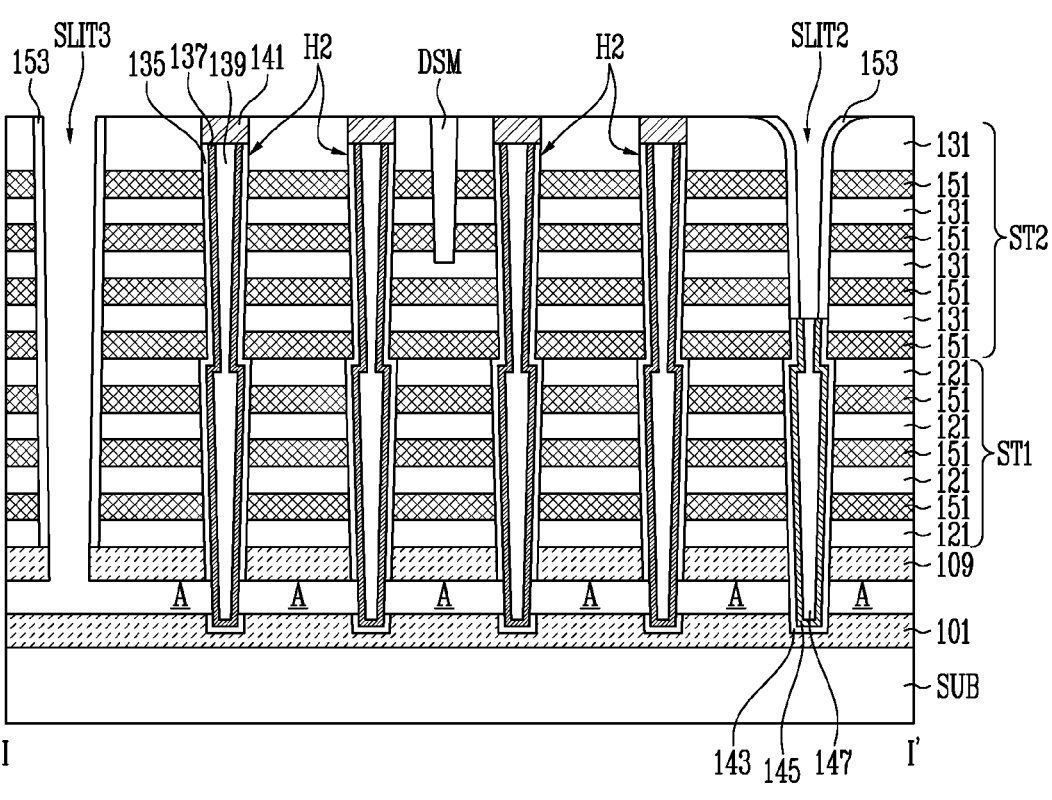

Referring to FIG. 5J, the sacrificial layer (105 shown in FIG. 5I) of the lower stack structure 100 may be exposed by etching a lower surface of the third slit SLIT3. That is, an etching process may be performed such that the sacrificial layer (105 shown in FIG. 5I) is exposed while the third slit SLIT3 penetrates the upper semiconductor layer 109.

Subsequently, a horizontal space A may be formed by removing the exposed sacrificial layer. Therefore, a sidewall of the memory layer 135 extending to the inside of the lower stack structure 100 may be exposed through the horizontal space A. Subsequently, a portion of the channel layer 137 may be exposed by etching a portion of the sidewall of the memory layer 135, which is exposed through the horizontal space A.

Figure 5K:
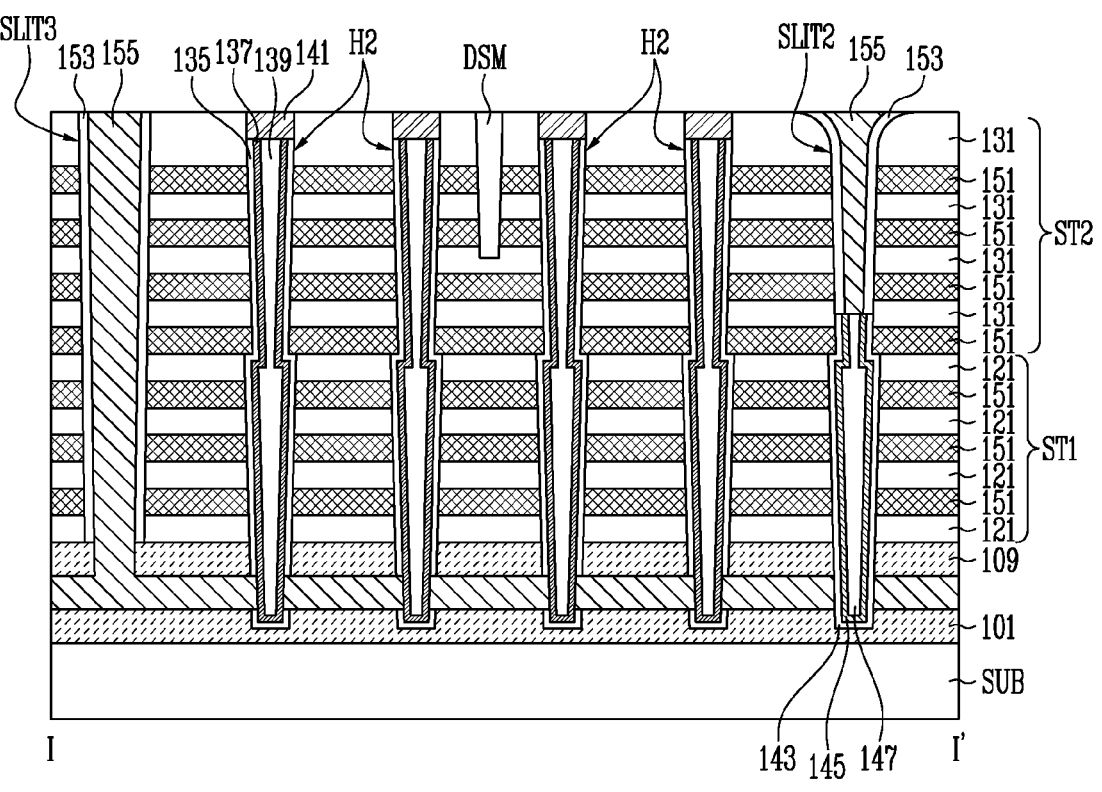

Referring to FIG. 5K, a channel connection pattern 155 may be formed by filling the horizontal space (A shown in FIG. 5J) with a conductive material for channel connection. The channel connection pattern 155 may be formed such that the lower and upper semiconductor layers 101 and 109 and the channel layer 137 are electrically connected to each other. The channel connection pattern 155 may be formed to be in contact with the lower and upper semiconductor layers 101 and 109 and the channel layer 137. The channel connection pattern 155 may include an n-type impurity or a p-type impurity. The channel connection pattern 155 may be used as a source contact by filling the third slit SLIT3.

The lower semiconductor layer 101, the channel connection pattern 153, and the upper semiconductor layer 109 may correspond to the first source layer SL1, the second source layer SL2, and the third source layer SL3, which are shown in FIG. 4.

In the process of forming the channel connection pattern 153, the second slit SLIT2 may be filled with the channel connection pattern 153. The channel connection pattern 153 formed inside the second slit SLIT2 may be defined as a fifth gap fill layer. The channel connection pattern 153 formed inside the second slit SLIT2 may be a structure electrically and physically isolated from the channel connection patter 153 filling the third slit SLIT3.

Figure 6:
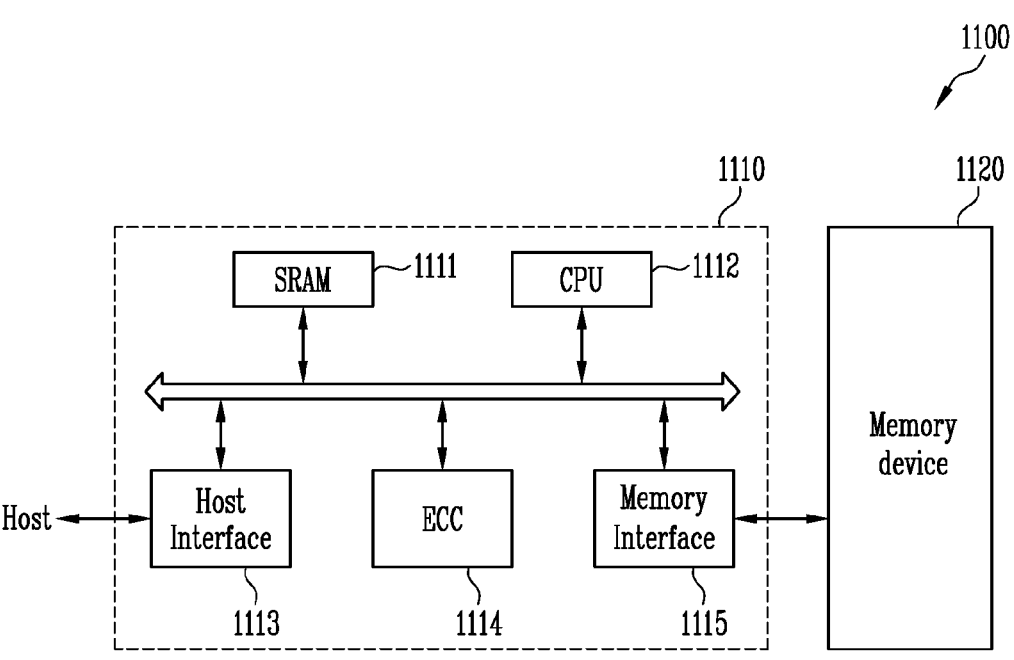
FIG. 6 is a diagram illustrating a configuration of a memory system in accordance with an embodiment of the present disclosure.

FIG. 6 is a diagram illustrating a configuration of a memory system in accordance with an embodiment of the present disclosure.

Referring to FIG. 6, the memory system 1100 in accordance with the embodiment of the present disclosure includes a memory device 1120 and a memory controller 1110.

The memory device 1120 may be a multi-chip package configured with a plurality of flash memory chips.

The memory controller 1110 controls the memory device 1120, and may include a Static Random Access Memory (SRAM) 1111, a CPU 1112, a host interface 1113, an Error correction circuit (ECC) 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected to the memory system 1100. In addition, the ECC 1114 detects and corrects an error included in data read from the memory device 1120, and the memory interface 1115 interfaces with the memory device 1120. In addition, the memory controller 1110 may further include a Read Only Memory (ROM) for storing code data for interfacing with the host, and the like.

The above-described memory system 1100 may be a memory card or a Solid State Disk (SSD), in which the memory device 1120 is combined with the memory controller 1110. For example, when the memory system 1100 is an SSD, the memory controller 1110 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 7:
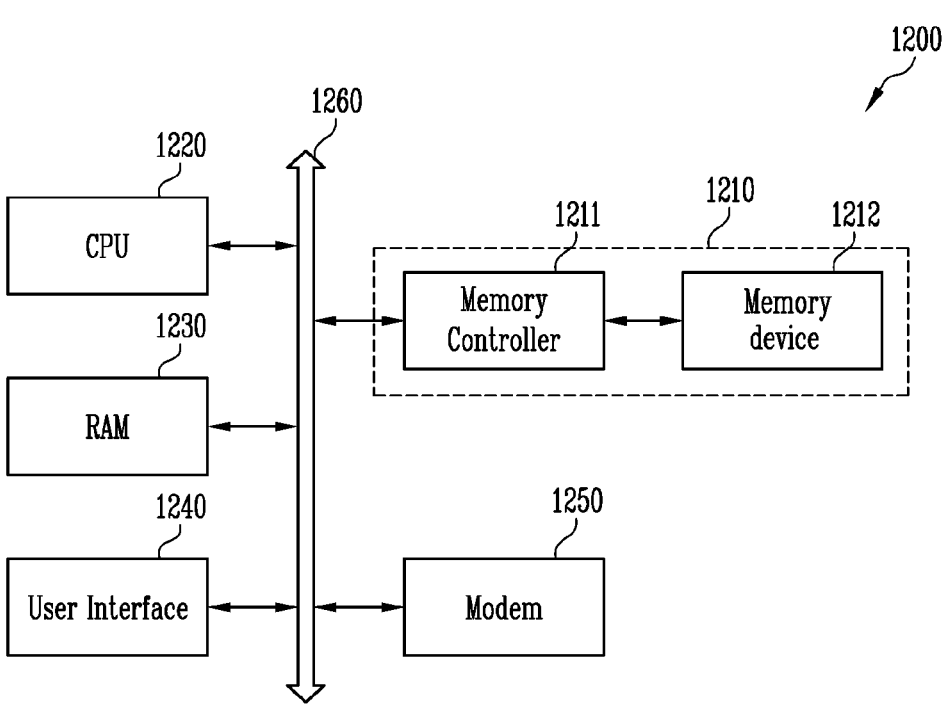
FIG. 7 is a diagram illustrating a configuration of a computing system in accordance with an embodiment of the present disclosure.

FIG. 7 is a diagram illustrating a configuration of a computing system in accordance with an embodiment of the present disclosure.

Referring to FIG. 7, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. Also, when the computing system 1200 is a mobile device, a battery for supplying an operation voltage to the computing system 1200 may be further included, and an application chip set, an image processor, a mobile D-RAM, and the like may be further included.

In accordance with the present disclosure, in an embodiment, a problem that a conductive layer for select lines and a conductive layer for word lines are disconnected from each other is reduced, so that the semiconductor device can have a stable structure.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor device comprising:
a stack structure including conductive patterns and interlayer insulating layers, which are alternately stacked on a substrate;
channel structures extending in a first direction and penetrating the stack structure;
a first slit extending in a second direction crossing the first direction and penetrating a first portion of the conductive patterns corresponding to select lines;
a second slit extending in the second direction and penetrating the first portion of the conductive patterns corresponding to the select lines, wherein a width of the second slit is greater than a width of the first slit; and
support structures disposed below the second slit and penetrating a second portion of the conductive patterns corresponding to word lines.

2. The semiconductor device of claim 1, wherein the support structures are in direct contact with the bottom surface of the second slit.

3. The semiconductor device of claim 1, wherein the support structures have a substantially cylindrical shape.

4. The semiconductor device of claim 1, wherein a depth of the second slit is equal to or greater than a depth of the first slit.

5. The semiconductor device of claim 1, further comprising third slits penetrating the stack structure and extending substantially parallel to each other in the second direction, wherein the channel structures are disposed between the third slits.

6. The semiconductor device of claim 5, further comprising a source structure formed below the stack structure.

7. The semiconductor device of claim 6, further comprising a source contact connected to the source structure and disposed in at least one of the third slits.

8. The semiconductor device of claim 6, wherein the channel structures extend through the stack structure and extend into the source structure.

9. The semiconductor device of claim 1, wherein the support structures include a first gap fill layer, a second gap fill layer surrounding the first gap fill layer, and a third gap fill layer surrounding the second gap fill layer, and wherein the second slit includes a fourth gap fill layer formed on a sidewall of the stack structure, and a fifth gap fill layer in contact with the fourth gap fill layer, the fifth gap fill layer filling a central portion of the second slit.

10. A semiconductor device comprising:

a stack structure including conductive patterns and interlayer insulating layers alternately stacked;

channel structures extending in a first direction and penetrating the stack structure;

first slits extending in a second direction crossing the first direction and penetrating a first portion of the conductive patterns corresponding to select lines;

a second slit extending in the second direction and penetrating the first portion of the conductive patterns corresponding to the select lines, wherein a width of the second slit is different from a width of each of the first slits;

support structures disposed below the second slit and penetrating a second portion of the conductive patterns corresponding to word lines; and third slits extending in the second direction and penetrating the first portion of the conductive patterns and the second portion of the conductive patterns.

11. The semiconductor device of claim 10, wherein the first slits and the second slit are disposed between the third slits.

12. The semiconductor device of claim 10, wherein the second slit is disposed between the first slits.

13. The semiconductor device of claim 10, wherein one of the first slits is disposed between the second slit and one of the third slits.

14. The semiconductor device of claim 10, wherein a width of the second slit is greater than a width of each of the first slits.

15. The semiconductor device of claim 10, wherein a width of each of the third slits is greater than a width of the second slit and a width of each of the first slits.

16. The semiconductor device of claim 10, wherein a depth of the second slit is equal to or greater than a depth of each of the first slits.

17. The semiconductor device of claim 10, wherein a depth of each of the third slits is greater than a depth of each of the first slits and the second slit.

18. The semiconductor device of claim 10, wherein the stack structure includes a first memory block and a second memory block, and wherein one of the third slits is disposed between the first memory block and the second memory block.

19. The semiconductor device of claim 18, wherein the first memory block includes a first channel group, a second channel group, a third channel group, and a fourth channel group, arranged along a third direction crossing the first and second directions, and wherein the first to fourth channel groups are defined by the first and second slits.

20. The semiconductor device of claim 19, wherein the first slits are disposed between the first channel group and the second channel group, and between the third channel group and the fourth channel group, and wherein the second slit and the support structures are disposed between the second channel group and the third channel group.

21. The semiconductor device of claim 19, wherein select lines corresponding to the first to fourth channel groups are separated from each other by the first and second slits, and wherein word lines corresponding to the first to fourth channel groups are shared in common.

\* \* \* \* \*